United States Patent
Won et al.

(10) Patent No.: US 7,049,648 B2
(45) Date of Patent: May 23, 2006

(54) SEMICONDUCTOR MEMORY DEVICE FOR REDUCING DAMAGE TO INTERLEVEL DIELECTRIC LAYER AND FABRICATION METHOD THEREOF

(75) Inventors: Seok-Jun Won, Seoul (KR); Cha-Young Yoo, Kyungki-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 68 days.

(21) Appl. No.: 10/309,547

(22) Filed: Dec. 3, 2002

(65) Prior Publication Data

US 2003/0082869 A1    May 1, 2003

Related U.S. Application Data

(62) Division of application No. 09/947,189, filed on Sep. 5, 2001, now Pat. No. 6,537,875.

(30) Foreign Application Priority Data

Sep. 15, 2000   (KR) .................................. 00-54213

(51) Int. Cl.
*H01L 27/108* (2006.01)
(52) U.S. Cl. ....................... 257/303; 438/244
(58) Field of Classification Search ................ 438/239, 438/244, 253–254, 387, 396; 257/303, 306
See application file for complete search history.

(56) References Cited

U.S. PATENT DOCUMENTS

| | | | |
|---|---|---|---|
| 5,162,248 A | 11/1992 | Dennison et al. | 437/52 |
| 5,340,763 A * | 8/1994 | Dennison | 438/396 |
| 5,518,948 A | 5/1996 | Walker | 438/386 |
| 5,904,703 A * | 5/1999 | Gilson | 606/213 |
| 6,114,201 A | 9/2000 | Wu | 438/254 |
| 6,180,974 B1 * | 1/2001 | Okutoh et al. | 257/306 |
| 6,274,899 B1 * | 8/2001 | Melnick et al. | 257/298 |
| 6,326,316 B1 | 12/2001 | Kiyotoshi et al. | 438/104 |

* cited by examiner

*Primary Examiner*—David Vu
(74) *Attorney, Agent, or Firm*—Marger Johnson & McCollom, P.C.

(57) ABSTRACT

The semiconductor memory device includes an interlevel dielectric pattern and an adhesive pattern, wherein both the interlevel dielectric and adhesive patterns include a contact hole to expose a semiconductor substrate. The adhesive pattern sufficiently adheres a lower electrode of a capacitor to the interlevel dielectric pattern, and thus prevents damage to the interlevel dielectric pattern during the formation of the capacitor. A conductive plug is disposed within the contact hole and may project higher than the top surface of the adhesive pattern. A leakage current preventive pattern is formed on top of the adhesive pattern and prevents a capacitor dielectric layer from directly contacting the plug to prevent occurrences of leakage current. A lower electrode of a capacitor electrically connected to the plug is formed on the plug.

10 Claims, 21 Drawing Sheets

US 7,049,648 B2

SEMICONDUCTOR MEMORY DEVICE FOR REDUCING DAMAGE TO INTERLEVEL DIELECTRIC LAYER AND FABRICATION METHOD THEREOF

This application is a divisional of U.S. patent application Ser. No. 09/947,189, filed on Sep. 5, 2001, now U.S. Pat. No. 6,537,875, which is herein incorporated by reference in it's entirety.

BACKGROUND OF THE INVENTION

1. Field of the Invention

The present invention relates to a semiconductor memory device and fabrication method thereof, and more particularly, to a semiconductor memory device in which a platinum group metal layer is adopted as a lower electrode, and fabrication method thereof.

2. Description of the Related Art

In order to improve the capacitance of a capacitor of a semiconductor memory device, it is very advantageous to form a lower electrode having a three-dimensional structure that increases the effective surface area of the capacitor while better utilizing available space. However, as the design rule of a semiconductor memory device decreases to below 0.2 μm, there are many problems with formation of a lower electrode having a three-dimensional structure.

FIGS. 1–4 are cross-sectional views for explaining a method of manufacturing a semiconductor memory device including a conventional capacitor. Referring to FIG. 1, after forming an interlevel dielectric layer 13 on a semiconductor substrate 11 such as a silicon substrate, a titanium nitride (TiN) plug 15 is formed within the interlevel dielectric layer 13. The interlevel dielectric layer 13 may be formed of silicon oxide. Then, a silicon nitride (SiN) layer 17 is formed on the interlevel dielectric layer 13 and the titanium nitride plug 15, on top of which a mold layer 19 of silicon oxide is formed. Referring to FIG. 2, the mold layer 19 and the silicon nitride layer 17 are patterned to form a groove 20 that exposes the titanium nitride plug 15. As a result, the mold layer 19 and the silicon nitride layer 17 become a mold pattern 19a and a silicon nitride pattern 17a, respectively. Then, a conductive layer 21 for a lower electrode is provided over the entire surface of the semiconductor substrate 11 on which the groove 20 has been formed. The conductive layer 21 is a platinum group noble metal layer such as a platinum (Pt) layer, a ruthenium (Ru) layer, or an Iridium (Ir) layer. Then, a sacrificial layer 23 for filling the groove 20 is formed over the entire surface of the semiconductor substrate 11 on which the conductive layer 21 has been formed. The sacrificial layer 23 is formed of photo resist or silicon oxide.

Referring to FIG. 3, using the mold pattern 19a as an etching stopper, the sacrificial layer 23 and the conductive layer 21 are sequentially etched to form a sacrificial pattern 23a and a lower electrode 21a.

Referring to FIG. 4, the lower electrode 21a is formed by removing the sacrificial pattern 23a and the mold pattern 19a by wet etching. Then, a capacitor dielectric layer (not shown) and an upper electrode (not shown) are provided over the lower electrode 21a to complete a capacitor of a semiconductor memory device.

According to a conventional method of manufacturing a semiconductor memory device, since the conductive layer 21, such as a ruthenium layer, exhibits low adhesive strength to the mold pattern 19a and silicon nitride pattern 17a, problems associated therewith occur, for example, the lower electrode 21a may collapse. As a result, the lower electrode 21a is not formed stably.

Furthermore, according to the conventional method, when removing the mold pattern 19a, the adhesive strength between the lower electrode 21a and the silicon nitride pattern 17a is so low that an oxide layer etching solution may penetrate the interface (in a direction of an arrow of FIG. 3) to damage the interlevel dielectric layer 13.

SUMMARY OF THE INVENTION

To solve the above problems, it is an objective of the present invention to provide a semiconductor memory device for stably forming a lower electrode of a capacitor while reducing damage to an interlevel dielectric layer.

It is another objective of the invention to provide a method of manufacturing a semiconductor memory device.

Accordingly, to achieve the above objectives, a semiconductor memory device according to the invention includes an interlevel dielectric pattern and an adhesive pattern, wherein both the interlevel dielectric and adhesive patterns include a contact hole therein to expose a semiconductor substrate. A plug is disposed within the contact hole. The plug may project higher than the top surface of the adhesive pattern. The adhesive pattern prevents a lower electrode of a capacitor from collapsing by sufficiently adhering the lower electrode to the interlevel dielectric pattern. Also, the adhesive pattern prevents damage to the interlevel dielectric pattern during the formation of the capacitor due to high adhesive strength to the plug.

The lower electrode of a capacitor is formed on the plug. The lower electrode of a capacitor has bottom and side wall surfaces, wherein at least a portion of the bottom surface thereof contacts a portion of the plug.

A leakage current preventive pattern is formed on the adhesive pattern and adjacent a portion of the side wall surfaces of the lower electrode. The leakage current preventive pattern prevents an increase in leakage current by preventing a capacitor dielectric layer to be formed on the lower electrode from directly contacting a plug, even if misalignment occurs during the formation of a lower electrode.

The present invention also provides a method of manufacturing a semiconductor memory device. According to the manufacturing method, a contact hole exposing a semiconductor substrate is formed in an adhesive pattern and in an interlevel dielectric pattern on the semiconductor substrate. The adhesive pattern prevents a lower electrode of a capacitor from collapsing by sufficiently adhering the lower electrode to the interlevel dielectric pattern. Also, the adhesive pattern prevents damage to the interlevel dielectric pattern during the formation of a capacitor due to high adhesive strength to a plug to be later formed.

Subsequently, a plug for filling the contact hole or a plug projecting higher than the surface of the adhesive pattern is formed. A groove exposing the plug is formed within a mold pattern. In addition, a leakage current preventive pattern forms on the adhesive pattern. The leakage current preventive pattern prevents the occurrences of the leakage current even if a misalignment of the lower electrode of a capacitor occurs.

Then, the lower electrode of a capacitor contacting the top surface of the plug exposed by the groove is formed.

Then, the mold pattern is removed, thereby completing a semiconductor memory device. As described above, the semiconductor memory device according to the present invention prevents the capacitor lower electrode from collapsing. This is because of the direct contact between capacitor lower electrode and the adhesive pattern having high adhesive strength. The semiconductor memory device can prevent damage to the interlayer dielectric pattern during the formation of the capacitor due to high adhesive strength between the adhesive pattern and the plug. Furthermore, the semiconductor memory device prevents leakage current from increasing by forming the leakage current preventive pattern, preventing a capacitor dielectric layer formed on the lower electrode from directly contacting the plug.

BRIEF DESCRIPTION OF THE DRAWINGS

The above objectives and advantages of the present invention will become more apparent by describing in detail a preferred embodiment thereof with reference to the attached drawings in which.

DETAILED DESCRIPTION OF THE INVENTION

Figure 1:
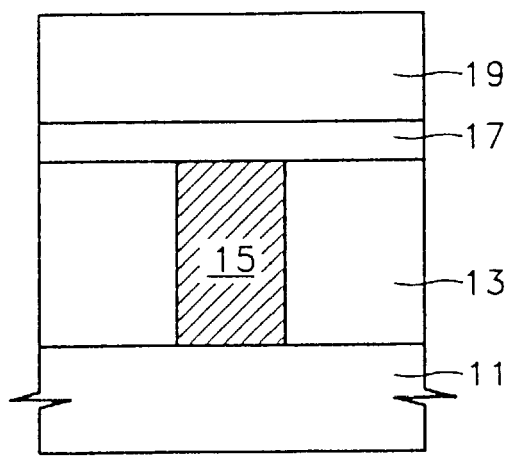
FIGS. 1–4 are cross-sectional views for explaining a method of manufacturing a semiconductor memory device including a conventional capacitor.
Figure 2:
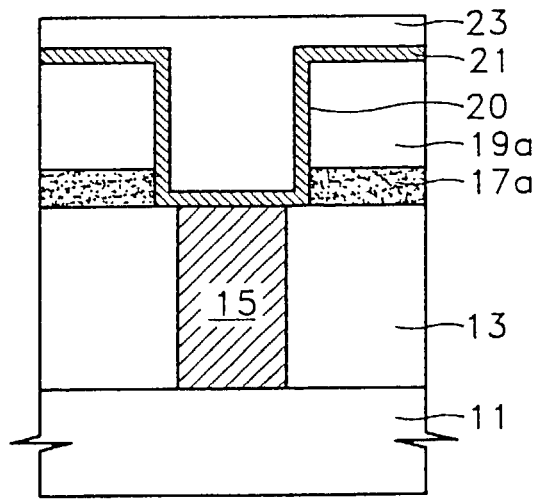

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the art. In the drawings, the shape of elements is exaggerated for clarity, and the same reference numerals appearing in different drawings represent the same element. Further, it will be understood that when a layer is referred to as being "on" another layer or substrate, it can be directly on the other layer or substrate, or intervening layers may also be present.

Figure 5:
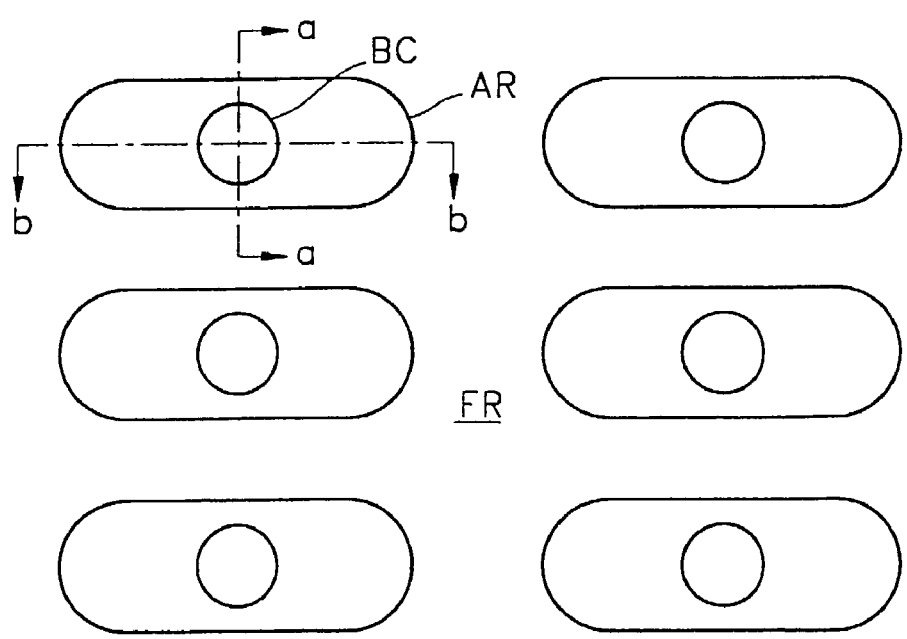
FIG. 5 is a layout diagram showing a semiconductor device according to the invention.

Referring to FIG. 5, the semiconductor memory device is divided into two regions, i.e., an active region (AR), and the remaining field region (FR). A buried contact hole BC is formed within the active region AR. A plug (not shown) is filled into the buried contact hole BC, and the plug and a lower electrode (not shown) of a capacitor are electrically interconnected.

Figure 6A:
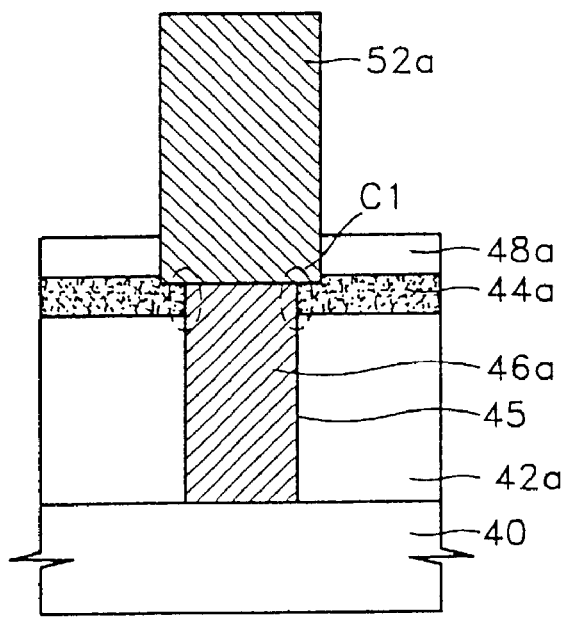
FIGS. 6A and 6B are cross-sectional views of a semiconductor memory device according to a first embodiment of the invention, taken along lines a—a and b—b of FIG. 5, respectively.
Figure 6B:
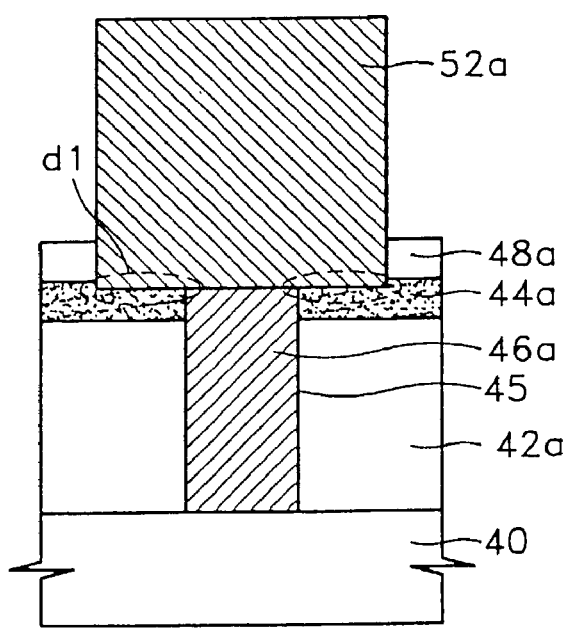

Referring to FIGS. 6A and 6B, an interlevel dielectric pattern 42a and an adhesive pattern 44a are provided over a semiconductor substrate 40, both having a contact hole 45 that exposes the semiconductor substrate 40. In other words, the contact hole 45 is formed in the interlevel dielectric pattern 42a and the adhesive pattern 44a. The interlevel dielectric pattern 42a is composed of a silicon oxide layer, while the adhesive pattern 44a is composed of a tantalum oxide ($Ta_2O_5$) layer.

A plug 46a is disposed within the contact hole 45, and the top surface of the plug 46a is as high as or lower than the adhesive pattern 44a. The plug 46a is formed of titanium nitride (TiN). A stack type lower electrode 52a of the capacitor is formed on top of the plug 46a. The stack type lower electrode 52a have a bottom surface and side wall surfaces, and at least a portion of the bottom surface contacts the top surface of the plug 46a. The stack type lower electrode 52a comprises a platinum group noble metal layer such as a platinum (Pt) layer, a ruthenium (Ru) layer, or an iridium (Ir) layer.

A leakage current preventive pattern 48a is formed on the adhesive pattern 44a and adjacent a portion of the side wall surfaces of the stack type lower electrode 52a. The leakage current preventive pattern 48a is composed of a tantalum oxide layer, a silicon nitride layer, or a combination thereof.

In particular, the semiconductor memory device according to the first embodiment of the invention is different from the conventional semiconductor device in that the stack type lower electrode 52a composed of a platinum group noble metal layer does not directly contact the interlevel dielectric pattern 42a formed of silicon oxide having low adhesive strength. Instead, the stack type lower electrode 52a of the capacitor is in contact with the adhesive pattern 44a formed of tantalum oxide having high or sufficient adhesive strength as denoted by reference character d1 of FIG. 6B, thereby significantly improving the adhesion between the stack type lower electrode 52a and the interlevel dielectric pattern 42a.

Figure 3:
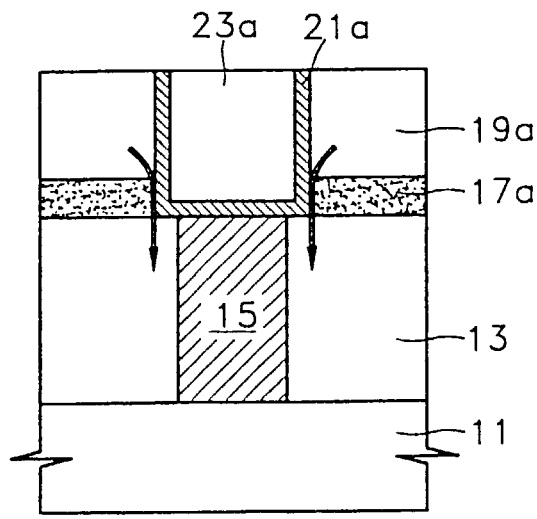
Figure 4:
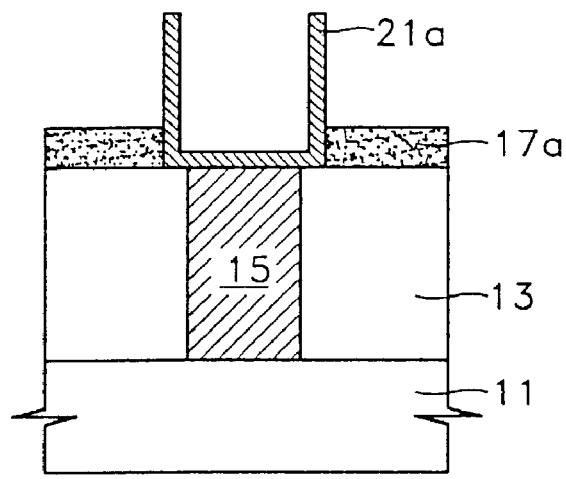
Figure 12A:
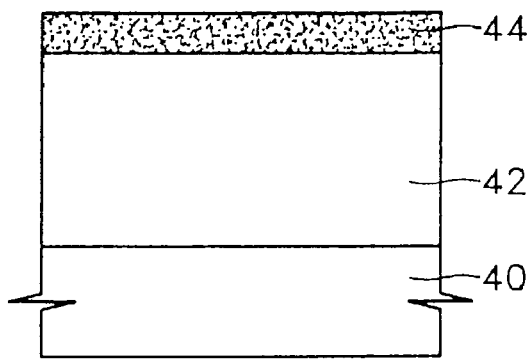
FIGS. 12A and 12G are cross-sectional views for explaining a method of manufacturing the semiconductor device of FIG. 6A.
Figure 12B:
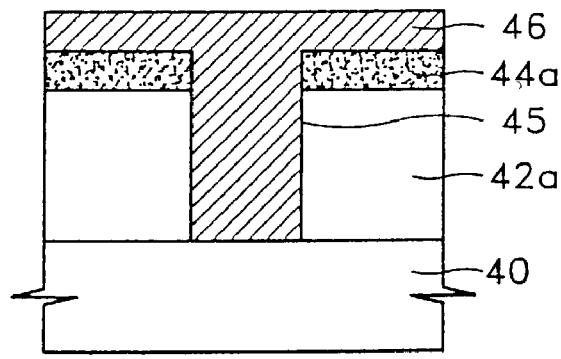
Figure 12C:
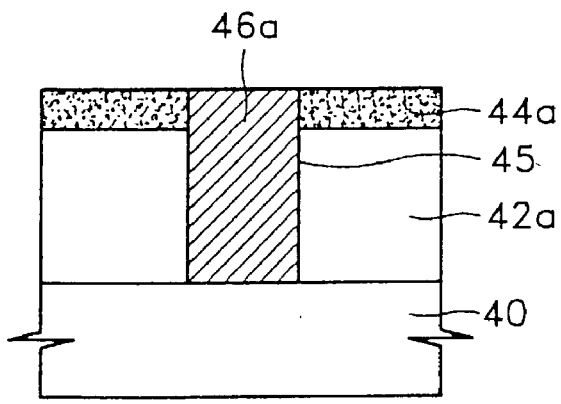
Figure 12D:
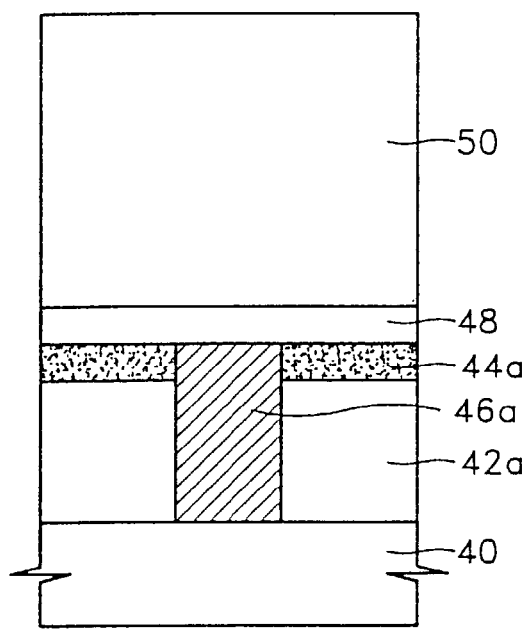
Figure 12E:
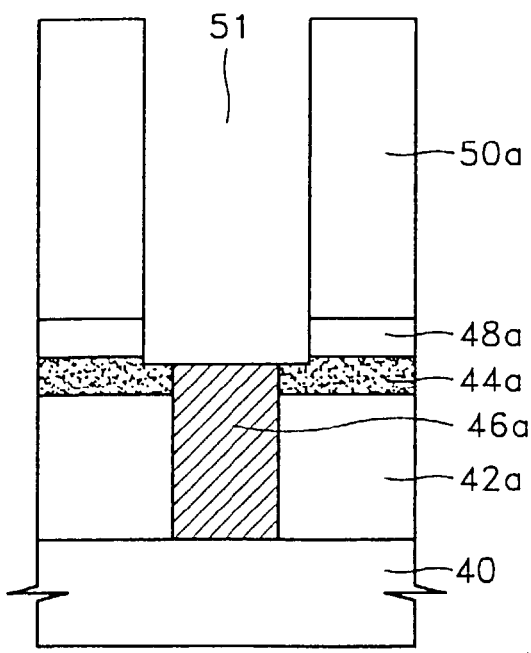
Figure 12F:
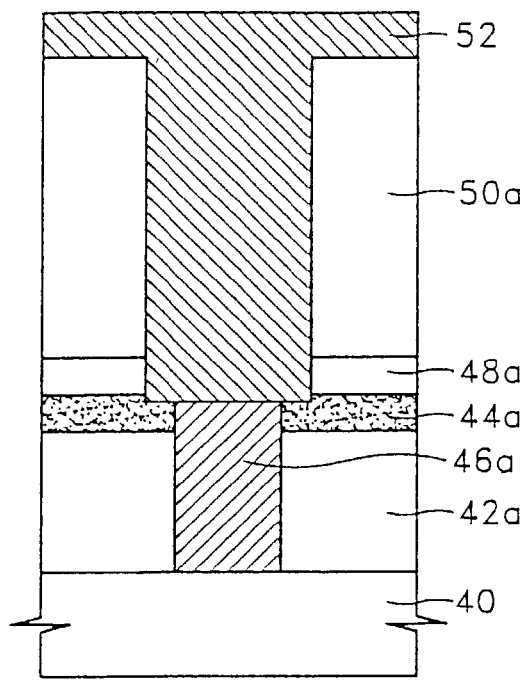
Figure 12G:
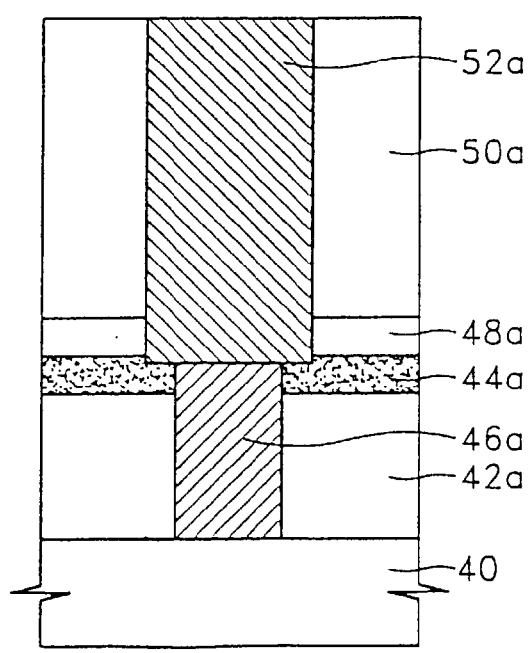

Furthermore, the adhesive pattern 44a prevents etching damage to the interlevel dielectric pattern 42a since the adhesion between the plug 46a and the adhesive pattern 44a as denoted by reference character C1 of FIG. 6A is strong such that there is substantially no path for an oxide etching solution to penetrate the interlevel dielectric pattern 42a, as indicated by the arrow of FIG. 3, during wet etching of a mold pattern (50a of FIG. 12G). In addition, in a semiconductor device according to one embodiment of the invention, the leakage current preventive pattern 48a is formed so as to prevent leakage current from increasing by preventing a capacitor dielectric layer (not shown) to be formed on top of the stack type lower electrode 52a from directly contacting the plug 46a, even if misalignment occurs during a photolithographic process for forming the stack type lower electrode 52a.

Figure 7A:
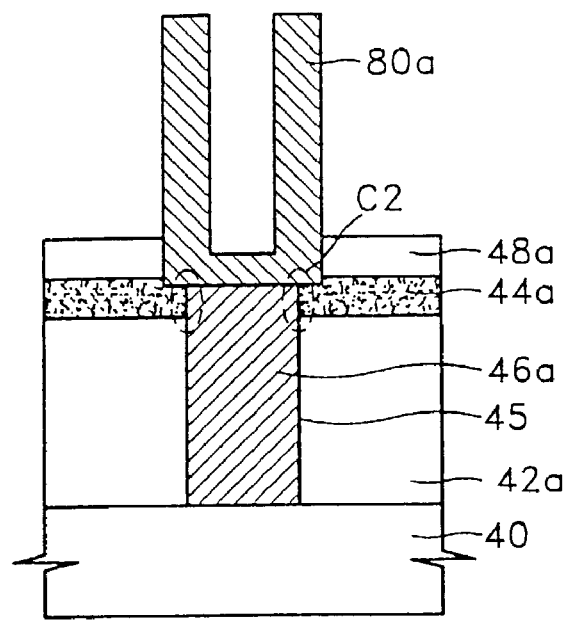
FIGS. 7A and 7B are cross-sectional views of a semiconductor memory device according to a second embodiment of the invention, taken along lines a—a and b—b of FIG. 5, respectively.
Figure 7B:
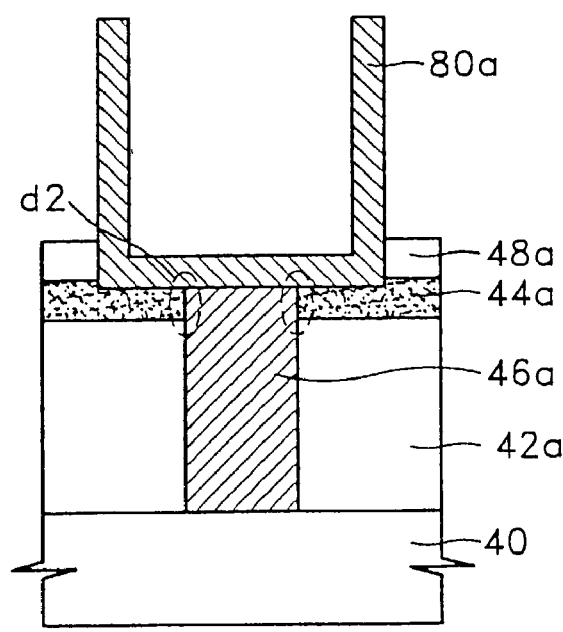

FIGS. 7A and 7B are cross-sectional views of a semiconductor device according to a second embodiment of the invention, taken along lines a—a and b—b of FIG. 5, respectively. In FIGS. 7A and 7B, the same reference number as in FIGS. 6A and 6B denotes the same element. The second embodiment is the same as the first embodiment except that a lower electrode is cylindrically shaped.

More specifically, in a capacitor of the semiconductor memory device according to the second embodiment of the invention, a cylindrical lower electrode 80a composed of a platinum group noble metal layer contacts the adhesive pattern 44a composed of a tantalum oxide layer having high adhesive strength, as denoted by reference character d2 of FIG. 7B, thereby significantly improving the adhesion between the cylindrical lower electrode 80a and the interlevel insulating pattern 42a.

Figure 13A:
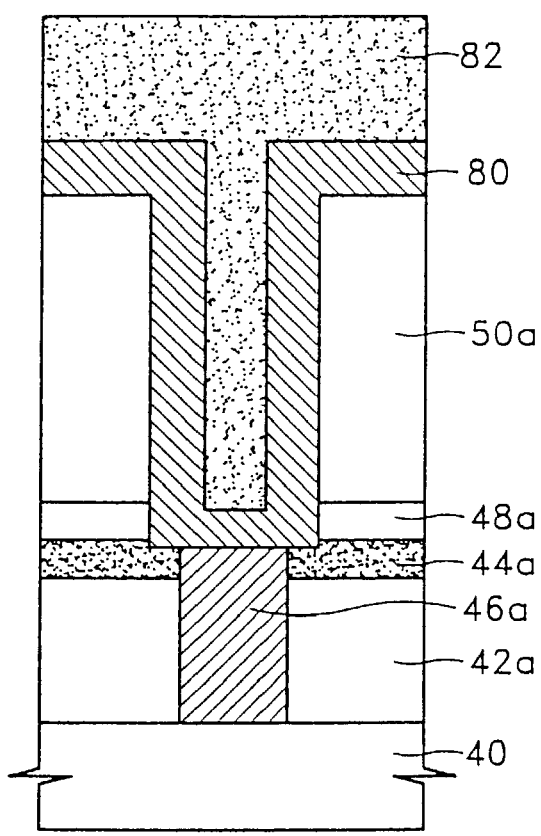
FIGS. 13A and 13B are cross-sectional views for explaining a method of manufacturing the semiconductor device of FIG. 7A.
Figure 13B:
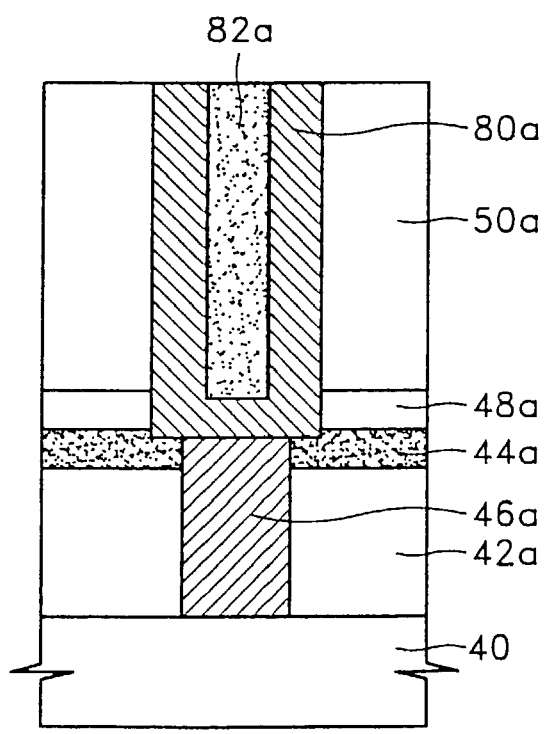

Furthermore, the adhesive pattern 44a prevents etching damage to the interlevel dielectric pattern 42a since the adhesion between the plug 46a and the adhesive pattern 44a as denoted by reference character C2 of FIG. 7A is strong such that there is substantially no path for oxide etching solution penetration, as indicated by the arrow of FIG. 3, during wet etching of a mold pattern (50a of FIG. 13B).

In addition, the leakage current preventive pattern 48a is formed so as to prevent a dielectric layer (not shown) to be formed on top of the cylindrical lower electrode 52a from directly contacting the plug 46a, even if misalignment occurs during a photolithographic process for forming the cylindrical lower electrode 52a. Thus, the leakage current preventive pattern 48a prevents leakage current from increasing.

Figure 8A:
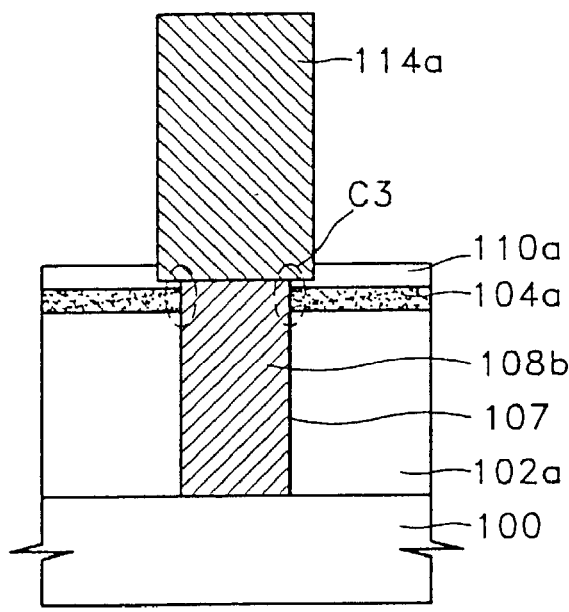
FIGS. 8A and 8B are cross-sectional views of a semiconductor memory device according to a third embodiment of the invention, taken along lines a—a and b—b of FIG. 5, respectively.
Figure 8B:
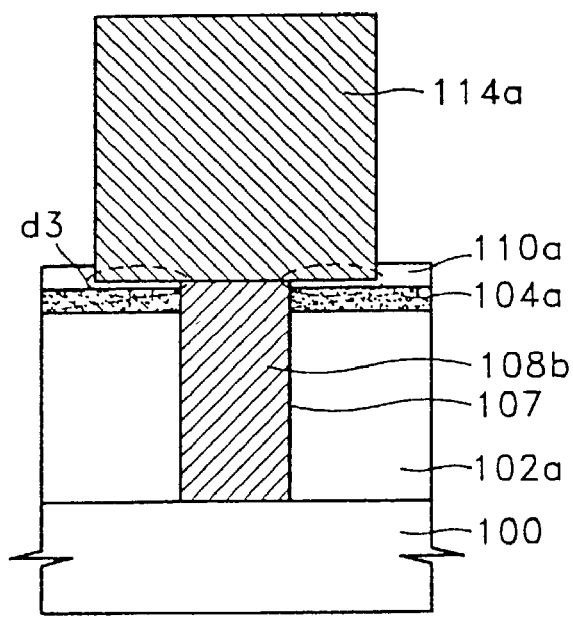

FIGS. 8A and 8B are cross-sectional views showing a semiconductor memory device according to a third embodiment of the invention taken along lines a—a and b—b of FIG. 5. Specifically, an interlevel dielectric pattern 102a, an adhesive pattern 104a, and a leakage current preventive pattern 110a are formed on a semiconductor substrate 110, all of which have a contact hole 107. The interlevel dielectric pattern 102a is formed of silicon oxide, while the adhesive pattern 104a is formed of tantalum oxide ($Ta_2O_5$). The leakage current preventive pattern 110a is composed of a tantalum oxide layer, a silicon nitride layer, or a combination thereof. The adhesive pattern 104a is formed thinner than the adhesive pattern 44a of the first and second embodiments. Furthermore, the contact hole 107 is formed also within the leakage current preventive pattern 110a unlike the first and second embodiments.

A plug 108b is filled within the contact hole 107, and it is projected higher than the top surface of the adhesive pattern 104a unlike the first and second embodiment. The plug 108b is composed of a titanium nitride (TiN) layer, on top of which a stack type lower electrode 114a is formed. The stack type lower electrode 114a have bottom and side wall surfaces, and at least a portion of the bottom surface is in contact with a portion of the top surface of the plug 108a. The stack type lower electrode 114a is composed of a platinum group noble metal layer such as a platinum (Pt) layer, a ruthenium (Ru) layer, or an iridium (Ir) layer.

In particular, the semiconductor memory device according to the third embodiment of the invention is different from the prior art in that the stack type lower electrode 114a composed of a platinum group noble metal layer does not directly contact the interlevel dielectric pattern 102 a that is formed of silicon oxide having low adhesive strength. Instead, the stack type lower electrode 114a of the capacitor is in contact with a leakage preventive pattern 110a as denoted by reference character d3 of FIG. 8B, thereby significantly improving the adhesion between the stack type lower electrode 114a and the interlevel dielectric pattern 102a.

Figure 14A:
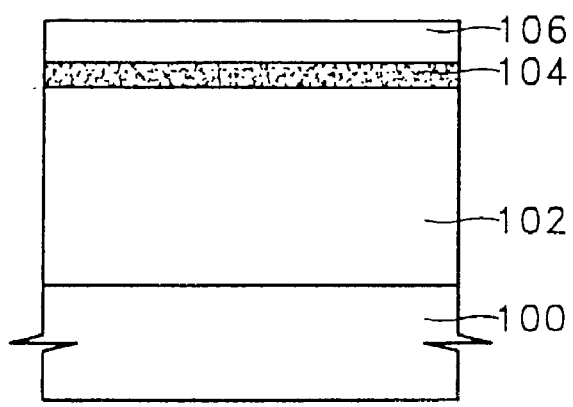
FIGS. 14A–14H are cross-sectional views for explaining a method of manufacturing the semiconductor device of FIG. 8A.
Figure 14B:
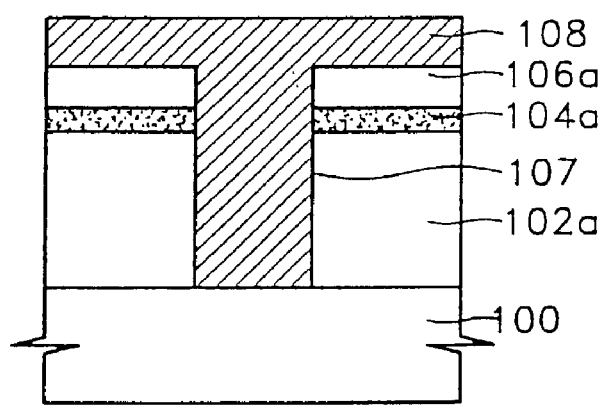
Figure 14C:
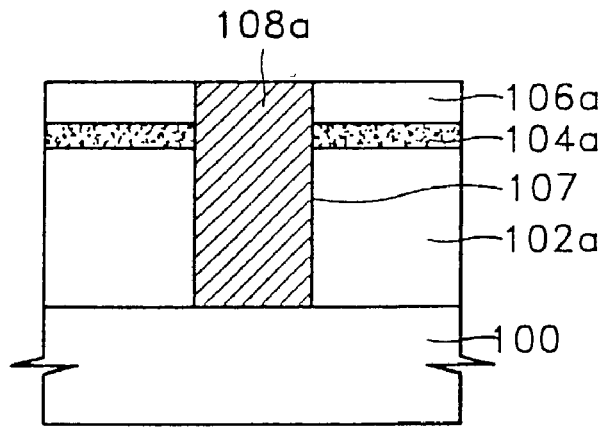
Figure 14D:
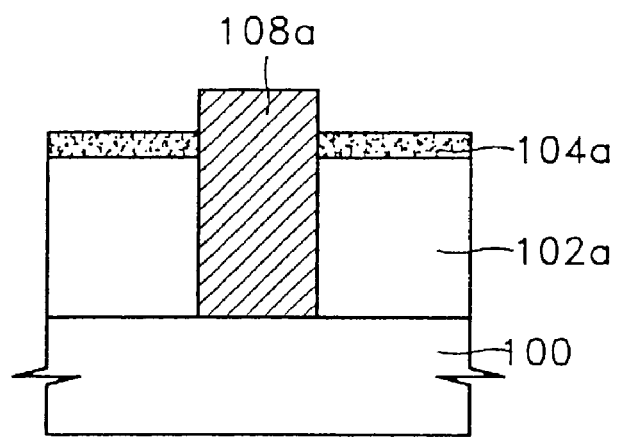
Figure 14E:
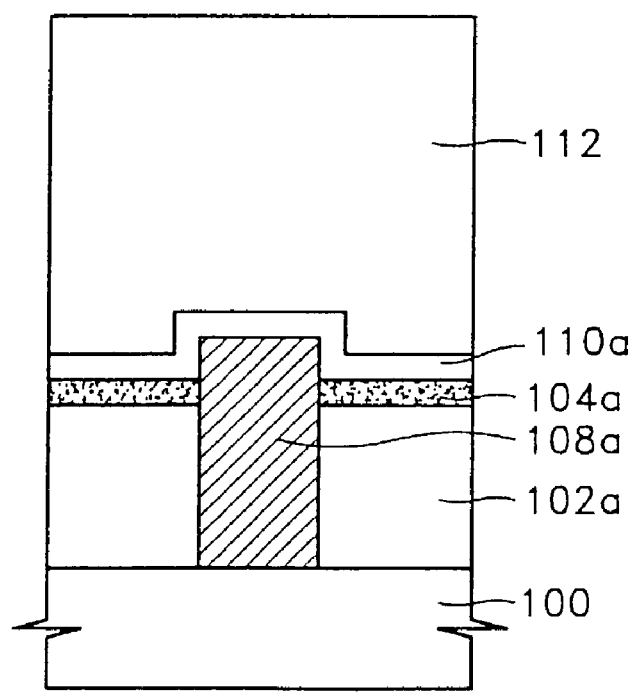
Figure 14F:
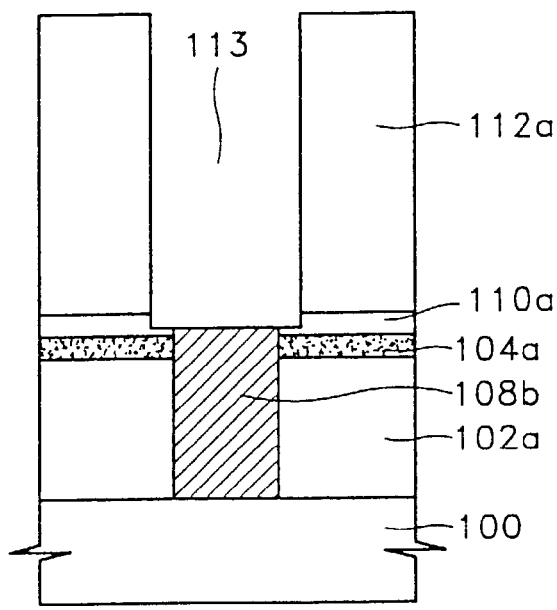
Figure 14G:
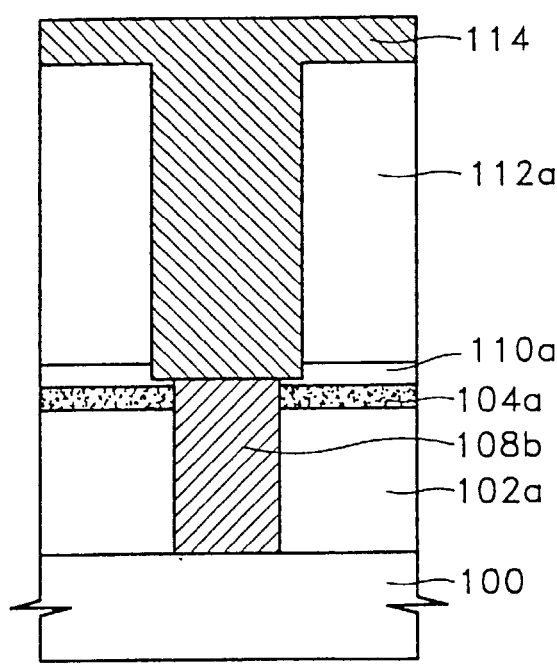
Figure 14H:
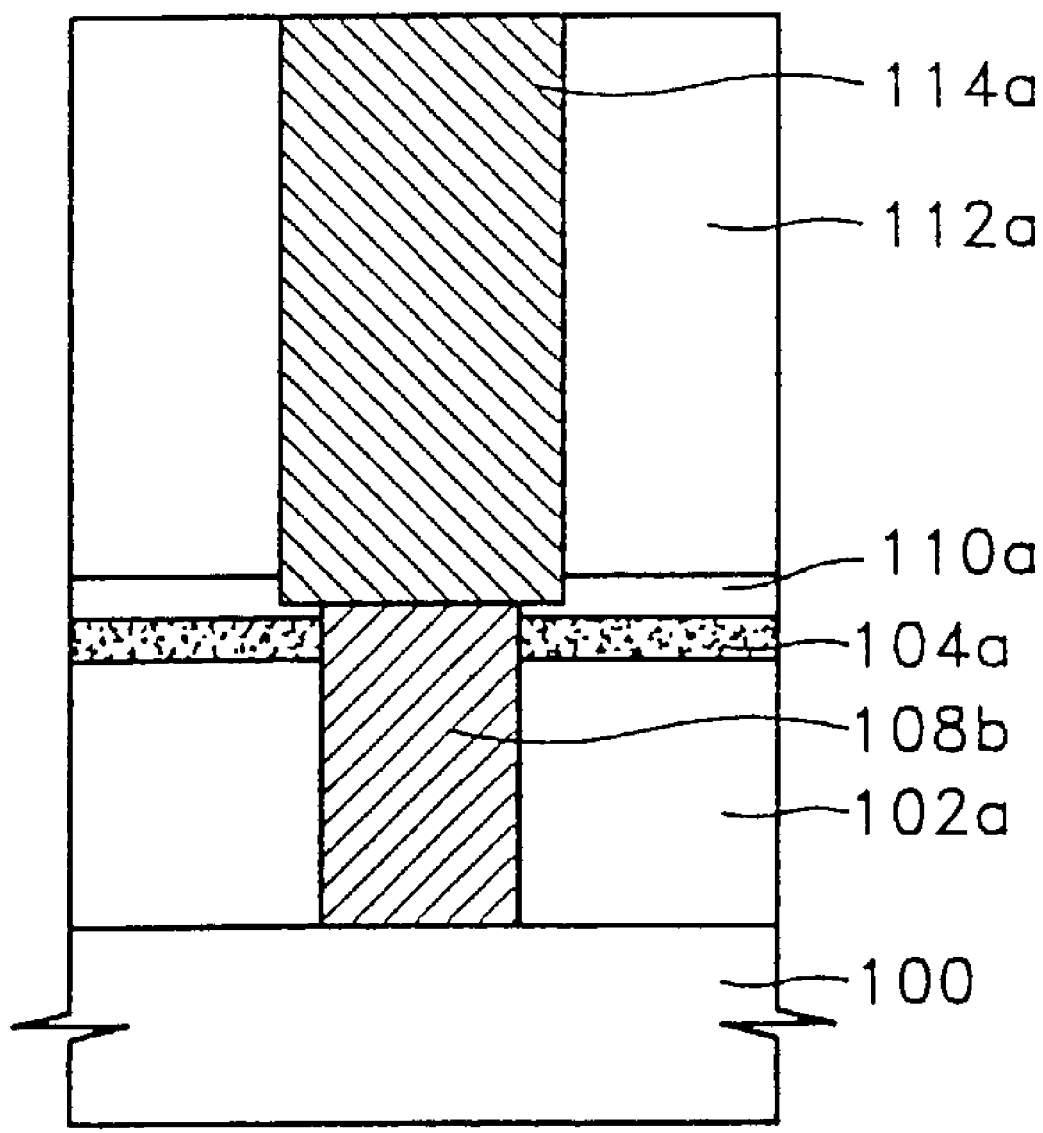

Furthermore, the adhesive pattern 104a prevents etching damage to the interlevel dielectric pattern 102a since the adhesive strength between the plug 108a and the adhesive pattern 104a as denoted by reference character C3 of FIG. 8A is high or sufficient such that there is substantially no path for oxide etching solution penetration as indicated by the arrow of FIG. 3, during wet etching of a mold pattern (112a of FIG. 14H). In addition, the leakage current preventive pattern 110a is formed on the adhesive pattern 104a and adjacent a portion of the side wall surface of the stack type lower electrode 114a, thus preventing leakage current from increasing. This is accomplished by preventing a capacitor dielectric layer (not shown) to be formed on top of the stack type lower electrode 114a from directly contacting the plug 108b, even if misalignment occurs during a photolithographic process for forming the stack type lower electrode 114a.

Figure 9A:
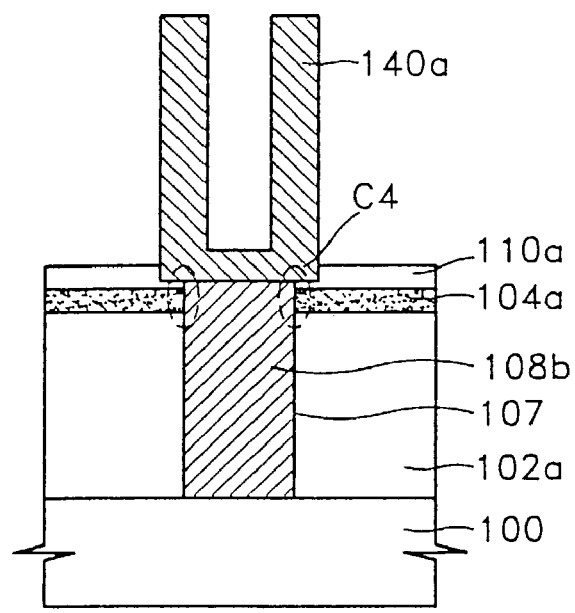
FIGS. 9A and 9B are cross-sectional views of a semiconductor memory device according to a fourth embodiment of the invention, taken along lines a—a and b—b of FIG. 5, respectively.
Figure 9B:
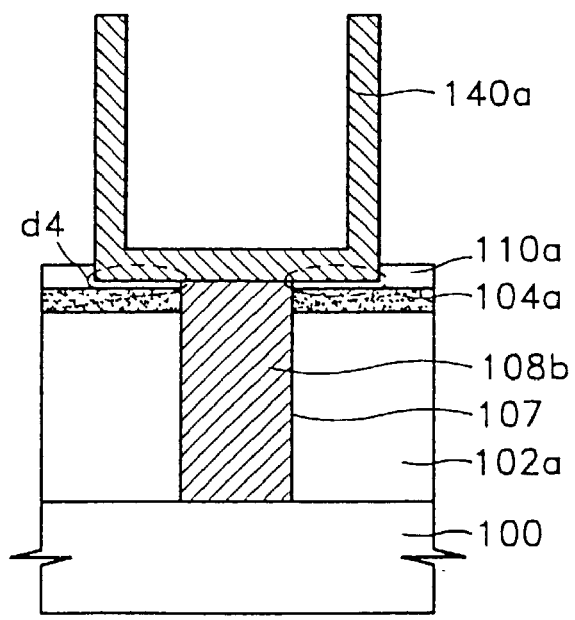

FIGS. 9A and 9B are cross-sectional views of a semiconductor device according to a fourth embodiment of the invention, taken along lines a—a and b—b of FIG. 5. In FIGS. 9A and 9B, the same reference number as in FIGS. 8A and 8B denotes the same element. The fourth embodiment is the same as the third embodiment except that a lower electrode is cylindrically shaped.

More specifically, in a capacitor of a semiconductor memory device according to the fourth embodiment of the invention, a cylindrical lower electrode 140a composed of a platinum group noble metal layer is in contact with the leakage current preventive pattern 110a, as denoted by reference character d4 of FIG. 9B, thereby significantly improving the adhesion between the cylindrical lower electrode 140a and the interlevel insulating pattern 102a.

Figure 15A:
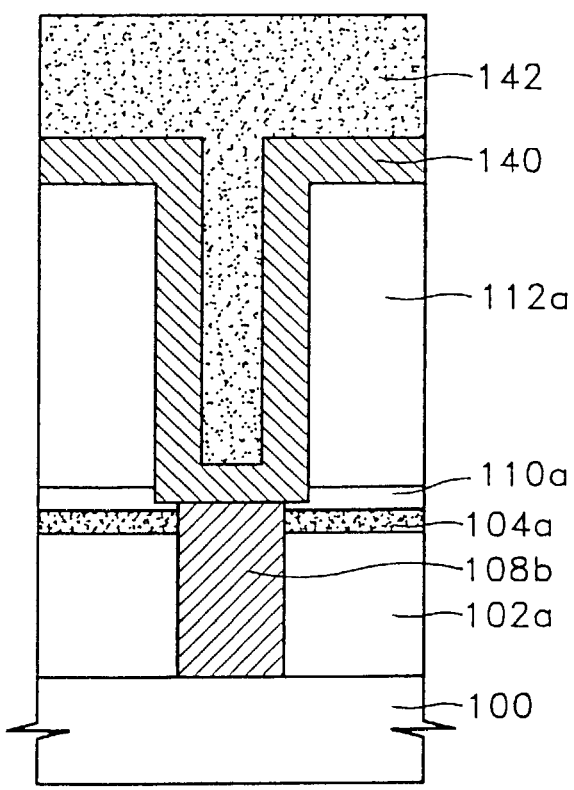
FIGS. 15A and 15B are cross-sectional views for explaining a method of manufacturing the semiconductor device of FIG. 9A.
Figure 15B:
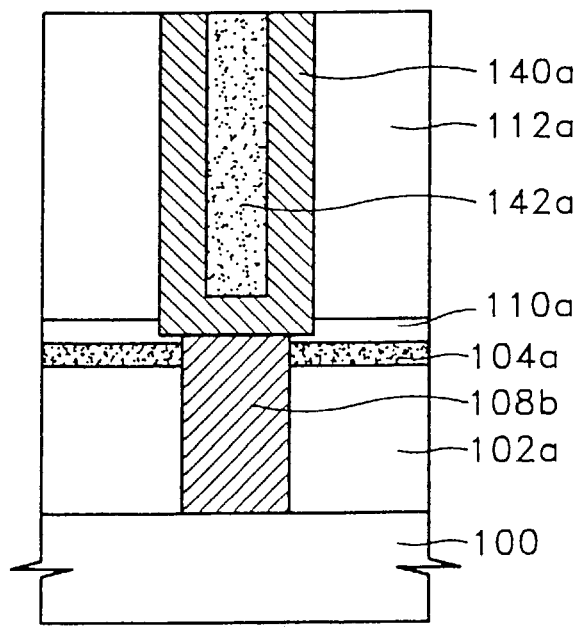

Furthermore, the adhesive pattern 104a prevents etching damage to the interlevel dielectric pattern 102a since the adhesion between the plug 108b and the adhesive pattern 104a as denoted by reference character C4 of FIG. 9A is strong such that there is substantially no path for oxide etching solution to penetrate, as indicated by the arrow of FIG. 3, during wet etching of a mold pattern (112a of FIG. 15B).

In addition, the leakage current preventive pattern 110a is formed on the adhesive pattern 104a and adjacent a portion of the side wall surface of the cylinder lower electrode 140a, thus preventing leakage current from increasing. This is accomplished by preventing a capacitor dielectric layer (not shown) to be formed on top of the cylindrical lower electrode 140a from directly contacting the plug 108b, even if misalignment occurs during a photolithographic process for forming the cylindrical lower electrode 140a.

Figure 10A:
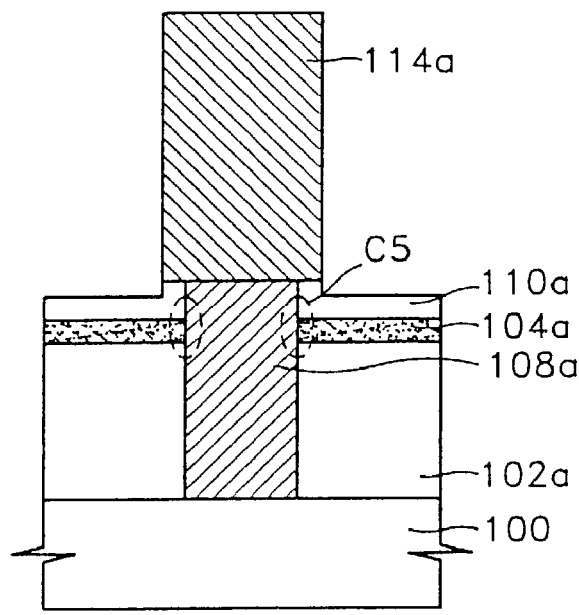
FIGS. 10A and 10B are cross-sectional views of a semiconductor memory device according to a fifth embodiment of the invention, taken along lines a—a and b—b of FIG. 5, respectively.
Figure 10B:
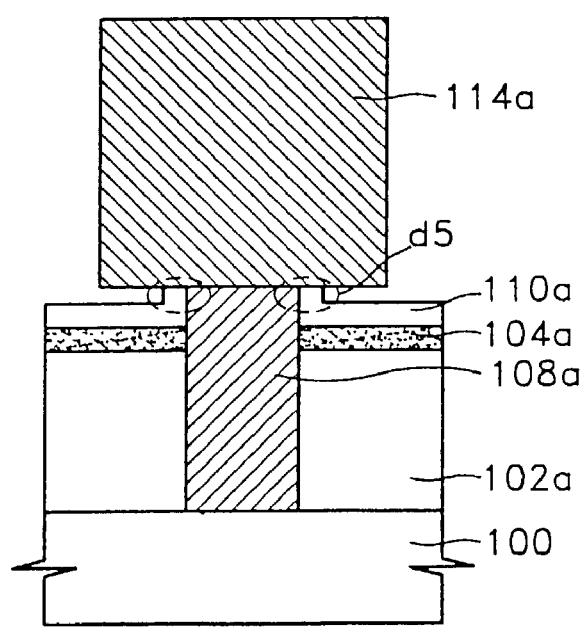

FIGS. 10A and 10B are cross-sectional views showing a semiconductor memory device according to a fifth embodiment of the invention, taken along lines a—a and b—b of FIG. 5. In FIGS. 10A and 10B, the same reference numerals as in FIGS. 8A and 8B denote the same element. The fifth embodiment of the invention is the same as the third embodiment thereof except that the plug 108a projects higher.

More specifically, in a capacitor of the semiconductor memory device according to the fifth embodiment of the invention, the stack gate type lower electrode 114a formed of a platinum group noble metal does not directly contact the interlevel dielectric pattern 102 a formed of silicon oxide having low adhesive strength. Instead, the stack type lower electrode 114a of the capacitor is in contact with the leakage preventive pattern 110a as denoted by reference character d5 of FIG. 10B, thereby significantly improving the adhesion between the stack type lower electrode 114a and the interlevel dielectric pattern 102a.

Figure 16A:
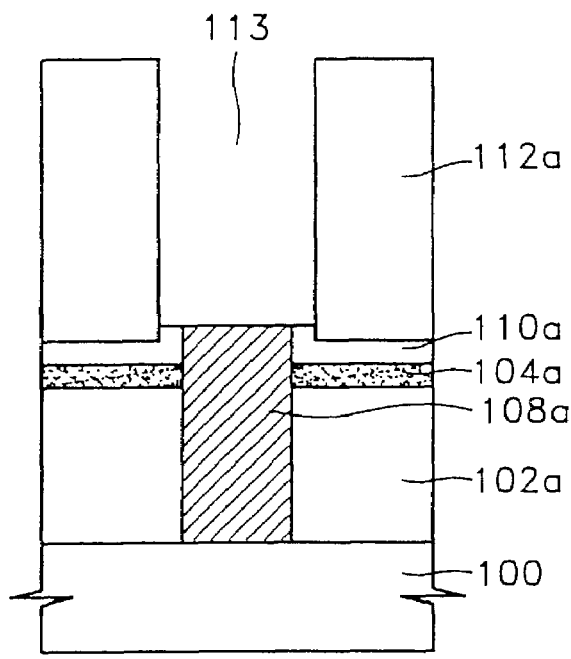
FIGS. 16A–16C are cross-sectional views for explaining a method of manufacturing the semiconductor device of FIG. 10A.
Figure 16B:
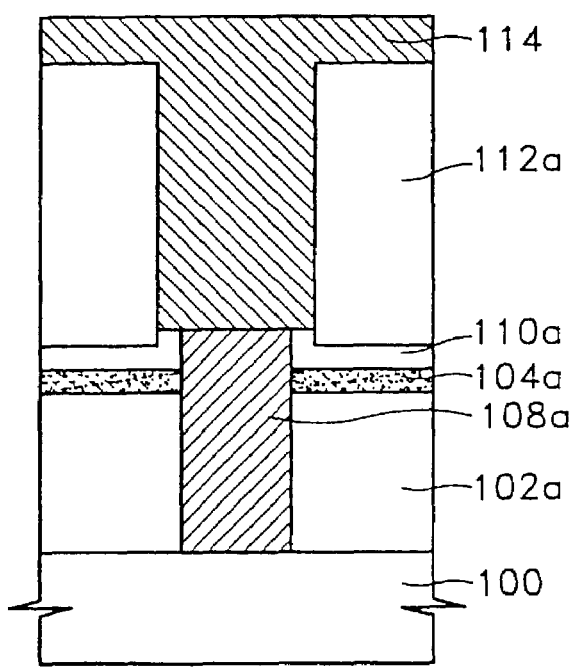
Figure 16C:
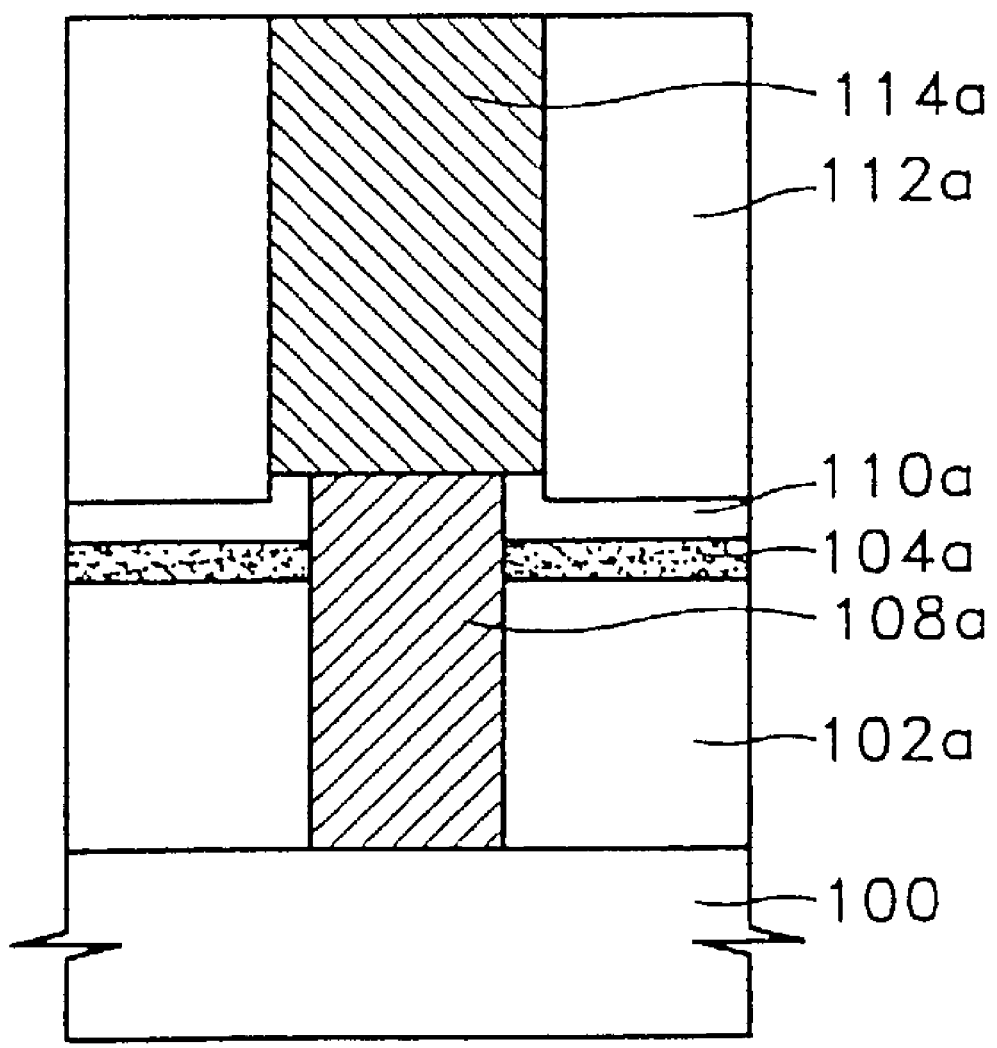

Furthermore, the adhesive pattern 104a prevents etching damage to the interlevel dielectric pattern 102a since the adhesive strength between the plug 108a and the adhesive pattern 104a as denoted by reference character C5 of FIG. 10A is high such that there is substantially no path for oxide etching solution penetration as indicated by the arrow of FIG. 3, during wet etching of a mold pattern (112a of FIG. 16C). In addition, the leakage current preventive pattern 110a is formed on the adhesive pattern 104a, thus preventing leakage current from increasing by preventing a capacitor dielectric layer (not shown) to be formed on top of the stack type lower electrode 114a from directly contacting the plug 108b, even if misalignment occurs during a photolithographic process for forming the stack type lower electrode 114a. Furthermore, in the semiconductor memory device according to the invention, the stack type lower electrode 114a is undercut to increase the capacitance of the capacitor.

Figure 11A:
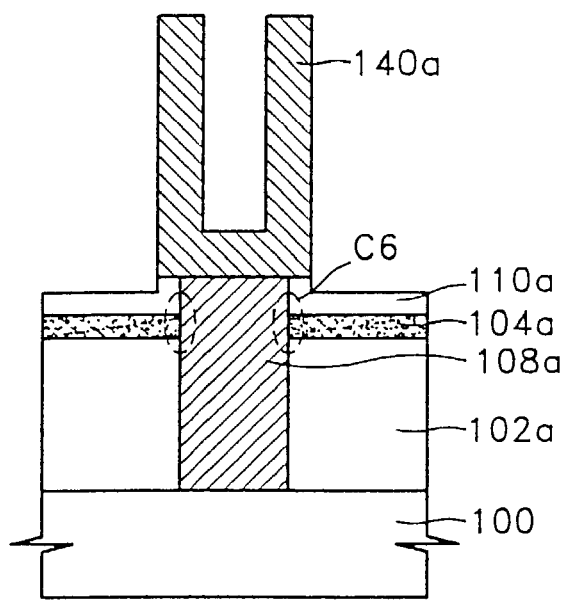
FIGS. 11A and 11B are cross-sectional views of a semiconductor memory device according to a sixth embodiment of the invention, taken along lines a—a and b—b of FIG. 5, respectively.
Figure 11B:
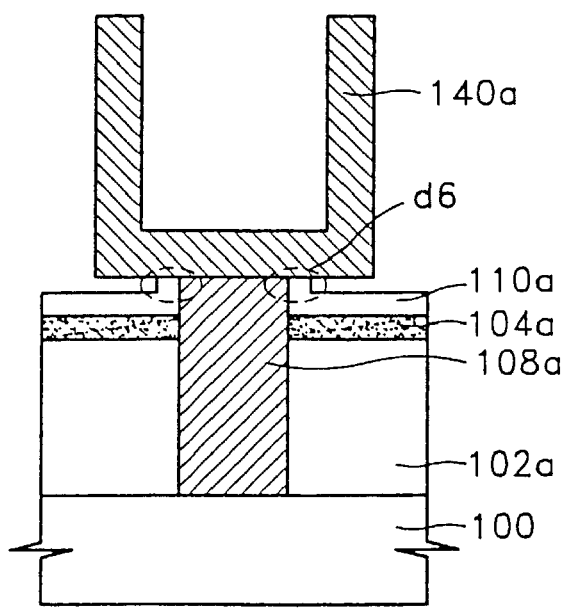

FIGS. 11A and 11B are cross-sectional views showing a semiconductor memory device according to a sixth embodiment of the invention, taken along lines a—a and b—b of FIG. 5. In FIGS. 11A and 11B, the same reference numerals as in FIGS. 10A and 10B denote the same elements. The sixth embodiment of the invention is the same as the fifth embodiment thereof except that a lower electrode is cylindrically shaped.

More specifically, a capacitor of the semiconductor memory device according to the sixth embodiment of the invention is different from the conventional one in that a cylindrical gate type lower electrode 140a formed of a platinum group noble metal does not directly contact the interlevel dielectric pattern 102a formed of silicon oxide having low adhesive strength. Instead, the cylindrical lower electrode 140a of the capacitor is in contact with the leakage preventive pattern 110a as denoted by reference character d5 of FIG. 10B, thereby significantly improving the adhesive strength between the cylindrical lower electrode 140a and the interlevel dielectric pattern 102a.

Figure 17A:
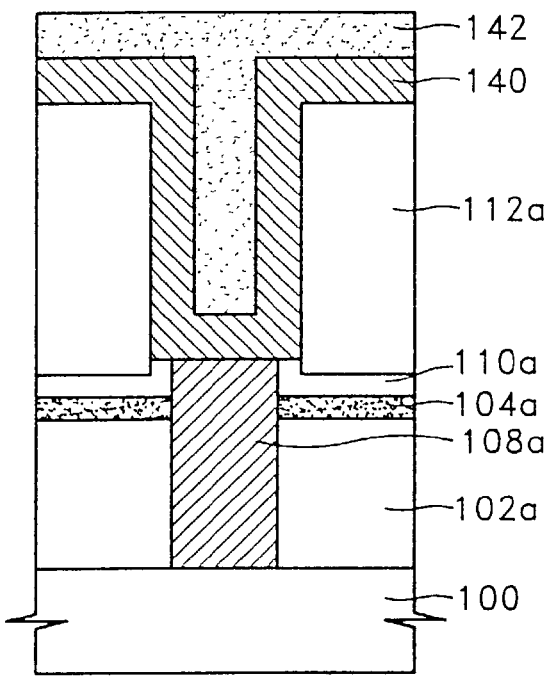
FIGS. 17A and 17B are cross-sectional views for explaining a method of manufacturing the semiconductor device of FIG. 11A.
Figure 17B:
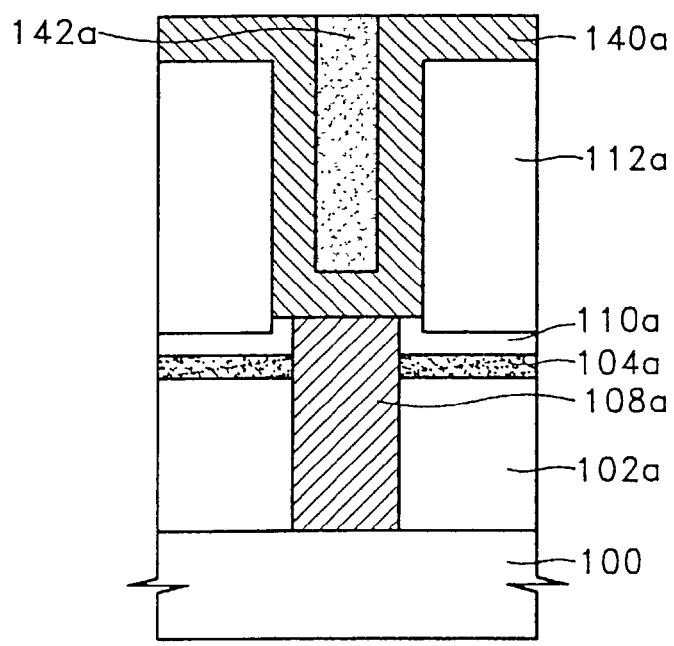

Furthermore, the adhesive pattern 104a prevents etching damage to the interlevel dielectric pattern 102a since the adhesion between the plug 108a and the adhesive pattern 104a as denoted by reference character C6 of FIG. 11A is strong such that there is substantially no path for oxide etching solution to penetrate as indicated by the arrow of FIG. 3, during wet etching of a mold pattern (112a of FIG. 17B). In addition, the leakage current preventive pattern 110a is formed on the adhesive pattern 104a, thus preventing leakage current from increasing. This is accomplished by preventing a capacitor dielectric layer (not shown) to be formed on the stack type lower electrode 114a from directly contacting the plug 108b, even if misalignment occurs during a photolithographic process for forming the cylindrical lower electrode 140a. FIGS. 12A–12G are cross-sectional views for explaining a method of manufacturing the semiconductor memory device of FIG. 6A. Referring to FIG. 12A, an interlevel dielectric layer 42 is formed over a semiconductor substrate 40 such as a silicon substrate. The interlevel dielectric layer 42 is formed of silicon oxide. Then, an adhesive layer 44 is formed on the interlevel dielectric layer 42. The adhesive layer 44 is formed of tantalum oxide ($Ta_2O_5$). The adhesive layer 44 increases adhesive strength between the lower electrode of a capacitor and the interlevel dielectric layer 42 as described in FIG. 6B. Furthermore, the adhesive layer 44 prevents etching damage to the interlevel dielectric layer 42 during a subsequent wet etching process of a mold pattern. The adhesive layer 44 needs to be formed sufficiently thick for an etching margin since a portion thereof may be etched while forming a groove or an opening in a subsequent process.

Turning to FIG. 12B, the adhesive layer 44 and the interlevel dielectric layer 42 are patterned to form a contact hole 45 that exposes the semiconductor substrate 40, while forming an adhesive pattern 44a and an interlevel dielectric pattern 42a. That is, the contact hole 45 is formed within the adhesive pattern 44a and the interlevel dielectric pattern 42a. Subsequently, a conductive layer 46 for a plug is formed for filling the contact hole 45 over the surface of the semiconductor substrate on which the adhesive pattern 44a and the interlevel dielectric pattern 42a have been formed. The conductive layer 46 for a plug is composed of a titanium nitride (TiN) layer.

Referring to FIG. 12C, using the surface of the adhesive pattern 44a as an etching stopper, the conductive layer 46 for a plug is etched or planarized to form a plug 46a. Etching of the conductive layer 46 for a plug is performed by means of etchback or chemical mechanical polishing (CMP).

Referring to FIG. 12D, a leakage current preventive layer 48 is formed on the plug 46a and the adhesive pattern 44a. The leakage current preventive layer 48 prevents leakage current from increasing due to a dielectric layer being in a direct contact with a plug layer as described above with reference to FIG. 14A. The leakage current preventive layer 48 is composed of a tantalum oxide layer, a silicon nitride layer, or a combination thereof. A mold layer 50 of silicon oxide is formed on top of the leakage current preventive layer 48.

Turning to FIG. 12E, the mold layer 50 and the leakage current preventive layer 48 are patterned to form a groove or an opening 51 that exposes the plug 46a. As a result, a mold pattern 50a and a leakage current preventive pattern 48a, both of which have a groove 51, are formed. As shown in FIG. 12E, the groove 51 may be formed by etching a portion of the adhesive pattern 44a as well. Relating to this, the adhesive pattern 44a needs to have a sufficient thickness such that a portion having high adhesive strength, as indicated by reference character C1 of FIG. 5, exists to prevent penetration of an oxide etching solution when removing the mold pattern 50a for a subsequent process.

Referring to FIG. 12F, a conductive layer 52 for a lower electrode of a capacitor is formed for filling the groove 51 over the entire surface of the semiconductor substrate 40 on which the mold pattern 50a and the leakage current preventive pattern 48a have been formed. The conductive layer 52 for a lower electrode of a capacitor is composed of a platinum group noble metal layer such as a platinum (Pt) layer, a ruthenium (Ru) layer, or an iridium (Ir) layer.

Referring to FIG. 12G, using the mold pattern 50a as an etching stopper, the conductive layer 52 for a lower electrode of a capacitor is etched or planarized to separate a stack type lower electrode 52a on a cell-by-cell basis. Etching of the conductive layer 52 for a lower electrode of a capacitor is performed by etchback or CMP. Subsequently, the mold pattern 50a is removed by wet etching to finally form the stack type lower electrode 52a as shown in FIG. 6A. During wet etching of the mold pattern 50a, the adhesive pattern 44a can prevent etching damage to the interlevel dielectric pattern 42a due to a portion having high adhesive strength as indicated by C1 of FIG. 6A. Next, a dielectric layer (not shown) and an upper electrode (not shown) are formed on top of the stack type lower electrode 52a to complete a capacitor of a semiconductor memory device. For a subsequent process, a general manufacturing process is performed.

FIGS. 13A and 13B are cross-sectional views for explaining a method of manufacturing the semiconductor memory device of FIG. 7A. In FIGS. 13A and 13B, the same reference numerals as in FIGS. 12A-12G denote the same elements. The manufacturing method thereof shown in FIGS. 13A and 13B is the same as that shown in FIGS. 12A–12G except that a cylindrical lower electrode 80a is formed.

More specifically, first, a manufacturing process is performed in the same manner as in FIGS. 12A–12E. Then, referring to FIG. 13A, a conductive layer 80 for a lower electrode is formed thin over the entire surface of the semiconductor substrate 40 on which the groove 51 has been formed. The conductive layer 80 is composed of a platinum group noble metal layer such as a platinum (Pt) layer, a ruthenium (Ru) layer, or an iridium (Ir) layer. Subsequently, a sacrificial layer 82 for filling the groove 51 is formed on the conductive layer 80 for a lower electrode. The sacrificial layer 82 is formed of silicon oxide.

Referring to FIG. 13B, using the surface of the mold pattern 50a as an etching stopper, the sacrificial layer 82 and the conductive layer for a lower electrode are etched or planarized to separate a cylindrical lower electrode 82a on a cell-by-cell basis. In this case, a sacrificial pattern 82a is formed between the cylindrical lower electrodes 80a. Etching of the sacrificial layer 82 and the conductive layer 80 for a lower electrode is performed by etchback or CMP.

Next, the mold pattern 50a and the sacrificial pattern 82a are removed by wet etching to finally form the cylindrical lower electrode 80a as shown in FIG. 7A. Next, a dielectric layer (not shown) and an upper electrode (not shown) are formed on top of the stack type lower electrode 52a to complete a capacitor of a semiconductor memory device. For a subsequent process, a general manufacturing process is performed.

FIGS. 14A–14H are cross-sectional views for explaining a method of manufacturing the semiconductor memory device of FIG. 8A. Referring to FIG. 14A, an interlevel dielectric layer 102 of silicon oxide is formed on a semiconductor substrate 100 such as a silicon substrate. An adhesive layer 104 of tantalum oxide ($Ta_2O_5$) is formed on the interlevel dielectric layer 102. The adhesive layer 104 increases the adhesive strength between the lower electrode 114a of a capacitor and an interlevel dielectric pattern 102a as shown in FIG. 8B. Furthermore, the adhesive layer 104 prevents etching damage to the interlevel dielectric pattern 102a during subsequent wet etching of a mold pattern. In particular, the adhesive layer 104 of FIG. 14A is formed thinner than the adhesive layer 44 of FIG. 12A. Subsequently, a first sacrificial layer 106 of silicon oxide is formed on top of the adhesive layer 104.

Referring to FIG. 14B, the first sacrificial layer 106, the adhesive layer 104, and the interlevel dielectric layer 102 are patterned to form a contact hole 107 exposing a region of the semiconductor substrate 100, while forming a first sacrificial pattern 106a, an adhesive pattern 104a, and an interlevel dielectric pattern 102a. That is, the contact hole 107 exposing the semiconductor substrate 100 is formed within the first sacrificial pattern 106a, the adhesive pattern 104a, and the interlevel dielectric pattern 102a.

Subsequently, a conductive layer 108 for a plug is formed for filling the contact hole 107 over the surface of the semiconductor substrate 100 on which the first sacrificial layer 106a, the adhesive pattern 104a, and the interlevel dielectric pattern 102a have been formed. The conductive layer 108 for a plug is formed of titanium nitride (TiN).

Referring to FIG. 14C, using the surface of the first sacrificial pattern 106a as an etching stopper, the conductive layer 108 is etched or planarized to form a plug 108a with which the contact hole 107 is filled. Etching of the conductive layer 108 is performed by etchback or CMP.

Referring to FIG. 14D, the first sacrificial pattern 106a is selectively removed so that the plug 108a may project higher than the top surface of the adhesive pattern 104a. If the plug 108a projects higher than the top surface of the adhesive pattern 104a, an etching margin is sufficiently provided when forming an opening or groove in a subsequent process, thereby reducing the thickness of the adhesive layer 104.

Referring to FIG. 14E, a leakage current preventive layer 110 is formed on the plug 108a and the adhesive pattern 104a. The leakage current preventive layer 110 projects as the plug 108a does. The leakage current preventive layer 110 prevents an increase of leakage current due to a dielectric layer being in a direct contact with a plug layer as will later be described with reference to FIG. 18B. The leakage current preventive layer 10 is composed of a tantalum oxide layer, a silicon oxide layer, or a combination thereof. A mold layer 112 of silicon oxide is formed on the leakage current preventive layer 110.

Referring to FIG. 14F, the mold layer 112 and the leakage current preventive layer 110 are patterned to form a mold pattern 112a and a leakage current preventive pattern 110a, both of which have a groove or opening 113 exposing a region of the plug 108a. In this case, the top surface of the plug 108a is etched to form a slightly projecting plug 108b, which is lower than the bottom surface of the mold pattern 112a but projects higher than the adhesive pattern 104a. During the formation of the opening 13, an etching margin is sufficiently provided to prevent etching of the adhesive pattern 104a because the plug 108a projects higher than the adhesive pattern 104a. Thus, even if the adhesive pattern 104a is thin, the adhesive pattern 104a is not etched. As a result, there is a portion having high adhesive strength as indicated by C3 of FIG. 8A to prevent penetration of an oxide etching solution during a subsequent process of removing the mold pattern 112a.

Referring to FIG. 14G, a conductive layer 114 for a lower electrode of a capacitor is formed for filling the groove 113 over the entire surface of the semiconductor substrate 100 on which the mold pattern 112a and the leakage current preventive pattern 110a have been formed. The conductive layer 114 for a lower electrode is composed of a platinum group noble metal layer such as a platinum (Pt) layer, a ruthenium (Ru) layer, or an iridium (Ir) layer.

Referring to FIG. 14H, using the surface of the mold pattern 112a as an etching stopper, the conductive layer 114 for a lower electrode is etched or planarized to separate a stack type lower electrode 114a on a cell-by-cell basis. Etching of the conductive layer 114 for a lower electrode is performed by etchback or CMP.

Subsequently, the mold pattern 112a is removed by wet etching to finally form the stack type lower electrode 114a as shown in FIG. 8A. The adhesive pattern 104a can prevent etching damage to the interlevel insulating pattern 102a due to a portion denoted by C3 of FIG. 8A during wet etching of the mold pattern 112a. Next, a dielectric layer (not shown) and an upper electrode (not shown) are formed on top of the stack type lower electrode 52a to complete a capacitor of a semiconductor memory device. For a subsequent process, a general manufacturing process is performed.

FIGS. 15A and 15B are cross-sectional views for explaining a method of manufacturing the semiconductor memory device of FIG. 9A. In FIGS. 15A and 15B, the same reference numerals as shown in FIGS. 14A–14H denote the same elements. The manufacturing method thereof shown in FIGS. 15A and 15B is the same as that shown in FIGS. 14A-14H except that a cylindrical lower electrode 140a is formed.

More specifically, first, a manufacturing process is performed in the same manner as shown in FIGS. 14A–14F. Then, referring to FIG. 15A, a conductive layer 140 for a lower electrode is formed thin over the entire surface of a semiconductor substrate 100 on which the groove 113 has been formed. The conductive layer 140 for a lower electrode is composed of a platinum group noble metal layer such as a platinum (Pt) layer, a ruthenium (Ru) layer, or an iridium (Ir) layer. A second sacrificial layer 142 for filling the groove 113 is formed on the conductive layer 140 for a lower electrode. The second sacrificial layer 142 is formed of silicon oxide.

Referring to FIG. 15B, using the surface of the mold pattern 112a as an etching stopper, the second sacrificial layer 142 and the conductive layer 140 for a lower electrode are etched or planarized to separate a cylindrical lower electrode 140a on a cell-by-cell basis. In this case, a second sacrificial pattern 142a is formed between the cylindrical lower electrodes 142a. Etching of the second sacrificial layer 142 and the conductive layer 140 for a lower electrode is performed using etchback or CMP.

Subsequently, the mold pattern 112a and the second sacrificial pattern 142a are removed by wet etching to finally form the cylindrical lower electrode 140a as shown in FIG. 9A. Then, a dielectric layer (not shown) and an upper electrode (not shown) are formed on top of the stack type lower electrode 52a to complete a capacitor of a semiconductor memory device. For a subsequent process, a general manufacturing process is performed.

FIGS. 16A–16C are cross-sectional views for explaining a method of manufacturing the semiconductor memory device of FIG. 10A. In FIGS. 16A–16C, the same reference numerals as in FIGS. 14A–14H denote the same elements.

First, a manufacturing process is performed in the same manner as shown in FIGS. 14A–14E. Then, referring to FIG. 16A, the mold layer 112 and the leakage current preventive layer 110 are patterned to form a mold pattern 112a and a leakage current preventive pattern 110a, both of which have a groove or an opening 113 exposing a region of the plug 108a. In this case, the bottom of the groove 113 is positioned on the surface of the plug 108a. In other words, the top surface of the plug 108a is higher than the bottom surface of the mold pattern 112a. Also, during the formation of the groove 113, an etching margin is provided to prevent etching of the adhesive pattern 104a, because the plug 108a projects higher than the top surface of the adhesive pattern 104a. Thus, even if the adhesive pattern 104a is thin, the adhesive pattern 104a is not etched, as a result of which there is a portion having high adhesive strength as indicated by C5 of FIG. 10A to prevent penetration of an oxide etching solution during a subsequent process of removing the mold pattern 112a.

Referring to FIG. 16B, a conductive layer 114 for a lower electrode of a capacitor is formed for filling the groove 113 over the entire surface of the semiconductor substrate 100 on which the mold pattern 112a and the leakage current preventive pattern 110a have been formed. The conductive layer 114 for a lower electrode is composed of a platinum group noble metal layer such as a platinum (Pt) layer, a ruthenium (Ru) layer, or an iridium (Ir) layer.

Referring to FIG. 16C, using the surface of the mold pattern 112a as an etching stopper, the conductive layer 114 for a lower electrode is etched or planarized to separate a stack type lower electrode 114a on a cell-by-cell basis. Etching of the conductive layer 114 for a lower electrode is performed by etchback or CMP.

Subsequently, the mold pattern 112a is removed by wet etching to finally form the stack type lower electrode 114a as shown in FIG. 10A. The adhesive pattern 104a can prevent etching damage to the interlevel insulating pattern 102a due to a portion denoted by C5 of FIG. 10A during wet etching of the mold pattern 112a. Next, a dielectric layer (not shown) and an upper electrode (not shown) are formed on top of the stack type lower electrode 52a to complete a capacitor of a semiconductor memory device. For a subsequent process, a general manufacturing process is performed.

FIGS. 17A and 17B are cross-sectional views for explaining a method of manufacturing the semiconductor memory device of FIG. 11A. In FIGS. 17A and 17B, the same reference numerals as in FIGS. 16A–16C denote the same elements. A method of manufacturing a semiconductor memory device shown in FIGS. 17A and 17B is the same as that shown in FIGS. 16A–16C, except that a cylindrical lower electrode 140a is formed.

More specifically, first, a manufacturing process is performed in the same manner as shown in FIG. 16A. Then, referring to FIG. 17A, a conductive layer 140 for a lower electrode is formed thin over the surface of the semiconductor substrate 100 on which the groove 113 has been formed. The conductive layer 114 for a lower electrode is composed of a platinum group noble metal layer such as a platinum (Pt) layer, a ruthenium (Ru) layer, or an iridium (Ir) layer. Next, a second sacrificial layer 142 of silicon oxide for filling the groove 113 is formed on the conductive layer 140 for a lower electrode.

Referring to FIG. 17B, using the surface of the mold pattern 112a as an etching stopper, the second sacrificial layer 142 and the conductive layer 140 for a lower electrode are etched or planarized to separate a cylindrical lower electrode 140a on a cell-by-cell basis. In this case, a second sacrificial pattern 142a is formed between the cylindrical lower electrodes 140a. Etching of the second sacrificial layer 142 and the conductive layer 140 for a lower electrode is performed by etchback or CMP.

Subsequently, the mold pattern 112a and the second sacrificial pattern 142a are removed by wet etching to finally form the cylindrical lower electrode 140a of a capacitor as shown in FIG. 11A. Next, a capacitor dielectric layer (not shown) and an upper electrode (not shown) are formed on top of the stack type lower electrode 52a to complete a capacitor of a semiconductor memory device. For a subsequent process, a general manufacturing process is performed.

Figure 18A:
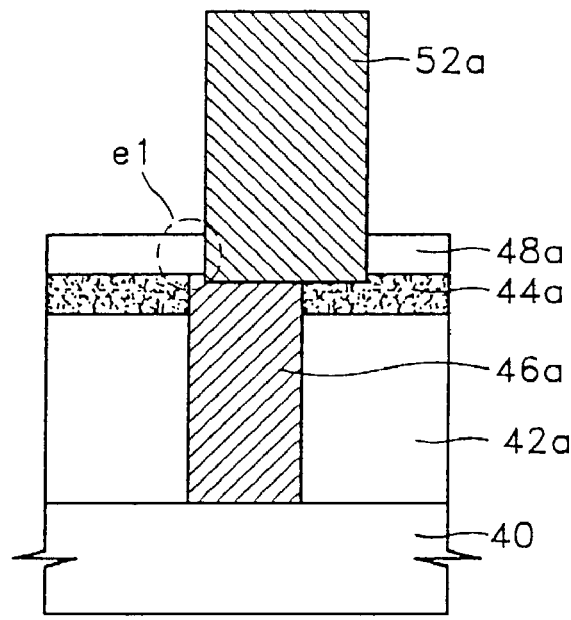
FIGS. 18A and 18B are cross-sectional views when the stack type lower electrodes are misaligned in manufacturing the semiconductor memory devices of FIGS. 6A and 8A, respectively.
Figure 18B:
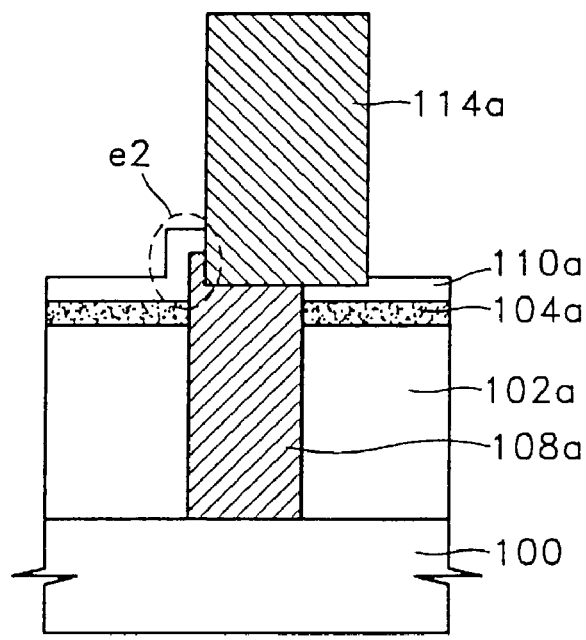

FIGS. 18A and 18B are cross-sectional views showing misalignment of the stack type lower electrodes when manufacturing the semiconductor memory devices of FIGS. 6A and 8A.

Specifically, when manufacturing a semiconductor memory device according to the invention, if the stack type lower electrode 52a or 114a is misaligned during photolithography for forming the same, the stack type lower electrode 52a or 114a is shifted toward one side of the plug 46a or 108a as shown in FIGS. 18A and 18B. Even if this occurs, according to the invention, a capacitor dielectric layer (not shown) to be formed on the stack type lower electrode 52a or 114a does not directly contact the plug 46a or 108a due to the leakage current preventive layer 48a or 110a, as indicated reference character e1 or e2. Thus, leakage current caused by a direct contact of the capacitor dielectric layer and the plug can be prevented.

As described above, in a semiconductor memory device according to the invention, a lower electrode composed of a platinum group noble metal layer is in a contact with an adhesive pattern formed of tantalum oxide having high adhesive strength instead of an interlevel dielectric pattern formed of silicon oxide having low adhesive strength. Accordingly, the adhesion between the lower electrode and the interlevel dielectric pattern is significantly improved.

Furthermore, there is substantially no path along which an oxide etching solution penetrates during wet etching of a mold pattern, thereby preventing etching damage to the interlevel dielectric pattern. Also, a leakage current preventive pattern is formed to prevent an increase in leakage current by preventing a capacitor dielectric layer to be formed on the lower electrode from directly contacting a plug, even if misalignment occurs during photolithography for forming a lower electrode.

Having illustrated and described the principles of my invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A semiconductor memory device comprising:
   an interlevel dielectric pattern and an adhesive pattern having a top surface sequentially disposed on a semiconductor substrate;
   a contact hole extending through both the interlevel dielectric pattern and the adhesive pattern to expose a region of the semiconductor substrate;
   a plug disposed within the contact hole;
   a lower electrode of a capacitor having bottom and side wall surfaces, wherein at least a portion of the bottom surface thereof contacts a pardon of the plug; and
   a leakage current preventive pattern formed on the adhesive pattern and adjacent a portion of the side wall surface of the lower electrode,
   wherein the leakage current preventive pattern overlaps the top surface of the adhesive pattern, wherein substantially all of the leakage current preventive pattern overlapping the top surface of the adhesive pattern directly contacts the top surface of the adhesive pattern, and
   wherein at least a portion of the leakage current preventive pattern is disposed between the lower electrode and the adhesive pattern, wherein the plug diseased within the contact hole projects higher than the ton surface of the adhesive pattern.

2. The semiconductor memory device of claim 1, wherein the lower electrode of the capacitor is either a stack type lower electrode or a cylindrical lower electrode.

3. The semiconductor memory device of claim 1, wherein the adhesive pattern is formed of tantalum oxide ($Ta_2O_5$).

4. The semiconductor memory device of claim 1, wherein the leakage current preventive pattern is composed of a tantalum oxide layer, a silicon nitride layer, or a combination thereof.

5. The semiconductor memory device of claim 1, wherein the lower electrode of the capacitor is formed of a platinum group noble metal.

6. A semiconductor memory device comprising:
   an interlevel dielectric pattern and an adhesive pattern having a top surface sequentially disposed on a semiconductor substrate;
   a contact hole extending through both the interlevel dielectric pattern and the adhesive pattern to expose a region of the semiconductor substrate;
   a plug disposed within the contact hole;
   a lower electrode of a capacitor having bottom and side wall surfaces, wherein at least a portion of the bottom surface thereof contacts a portion of the plug; and
   a leakage current preventive pattern formed on the adhesive pattern and adjacent a portion of the side wall surface of the lower electrode,
   wherein the leakage current preventive pattern overlaps the top surface of the adhesive pattern, wherein substantially all of the leakage current preventive pattern overlapping the top surface of the adhesive pattern directly contacts the top surface of the adhesive pattern, wherein at least a portion of the leakage current preventive pattern is disposed between the lower electrode and the adhesive pattern, and wherein the lower electrode of the capacitor is not in direct contact with the adhesive pattern.

7. The semiconductor memory device of claim 6, wherein the lower electrode of the capacitor is either a stack type lower electrode or a cylindrical lower electrode.

8. The semiconductor memory device of claim 6, wherein the adhesive pattern is formed of tantalum oxide ($Ta_2O_5$).

9. The semiconductor memory device of claim 6, wherein the leakage current preventive pattern is composed of a tantalum oxide layer, a silicon nitride layer, or a combination thereof.

10. The semiconductor memory device of claim 6, wherein the lower electrode of the capacitor is formed of a platinum group noble metal.

* * * * *

UNITED STATES PATENT AND TRADEMARK OFFICE
CERTIFICATE OF CORRECTION

| | |
|---|---|
| PATENT NO. | : 7,049,648 B2 |
| APPLICATION NO. | : 10/309547 |
| DATED | : May 23, 2006 |
| INVENTOR(S) | : Seok-Jun Won et al. |

Page 1 of 1

It is certified that error appears in the above-identified patent and that said Letters Patent is hereby corrected as shown below:

Column 13, line 56, the word "pardon" should read -- portion --;
Column 14, line 7, the word "diseased" should read -- disposed --;
Column 14, line 8, the word "ton" should read -- top --.

Signed and Sealed this

Twenty-eighth Day of July, 2009

JOHN DOLL
*Acting Director of the United States Patent and Trademark Office*